United States Patent [19]

Ellis

[11] 4,354,895
[45] Oct. 19, 1982

[54] METHOD FOR MAKING LAMINATED MULTILAYER CIRCUIT BOARDS

[75] Inventor: Theron L. Ellis, Vestal, N.Y.

[73] Assignee: International Business Machines Corporation, Armonk, N.Y.

[21] Appl. No.: 325,614

[22] Filed: Nov. 27, 1981

[51] Int. Cl.³ .............................................. C23F 1/02
[52] U.S. Cl. ...................................... 156/631; 29/848; 156/150; 156/632; 156/634; 156/902; 174/68.5; 204/15; 204/23; 427/96; 430/315
[58] Field of Search .............................. 156/629–634, 156/656, 664, 666, 901, 902, 150, 151, 153; 174/68.5; 427/96; 204/15, 23, 27; 29/846, 848, 855, 856, 841; 430/313, 315, 318; 264/271, 272

[56] References Cited

U.S. PATENT DOCUMENTS

| | | | |
|---|---|---|---|
| 2,666,008 | 1/1954 | Enshein et al. | 156/634 |
| 3,042,591 | 7/1962 | Cado | 204/15 |
| 3,324,014 | 6/1967 | Modjeska | 204/15 |
| 3,546,011 | 12/1970 | Knorre et al. | 427/96 |
| 3,688,396 | 9/1972 | Kilby et al. | 264/272 X |

*Primary Examiner*—William A. Powell
*Attorney, Agent, or Firm*—Norman R. Bardales

[57] ABSTRACT

A laminate for a laminated multilayer circuit board incorporates as a constituent member the plating layer from a peel-apart temporary base used in the fabrication of the laminate. The layer, with its one surface superimposed on the base, has additively plated to its opposite surface individual conductors and is subsequently personalized in register with the pattern of the plated conductor circuitry. The personalized layer and the plated conductors are embedded in a dielectric layer, the superimposed surface being flush mounted in the dielectric layer. The base has a rough-like surface profile characteristic that imparts at least a conformal surface profile characteristic in the superimposed surface of the plating layer which in turn provides improved adherence of this superimposed flush mounted surface, when subsequently exposed by the removal of the peel-apart base, to another dielectric layer thereafter laminated to the embedding dielectric layer to inhibit delamination between the two dielectric layers. Preferably, the base also imparts a conformal profile surface characteristic either to the plating surface to improve the plating bond between the plating layer and conductors, and/or to the laminating surface of the embedding dielectric layer to improve the lamination bond between the two dielectric layers, which combine with the conformal characteristic of the plating layer's flush mounted surface to inhibit synergistically delamination between the two dielectric layers.

12 Claims, 14 Drawing Figures

METHOD FOR MAKING LAMINATED MULTILAYER CIRCUIT BOARDS

BACKGROUND OF THE INVENTION

1. Field of the Invention

This invention is related to laminated multilayer circuit boards and the like and more particular to improvements in the fabrication thereof.

2. Description of the Prior Art

Various methods well known to those skilled in the art are used to produce laminated multilayer printed circuit boards.

One such prior art method is described, for example, in the publication entitled "High Resolution Circuitization Process", J. G. Cutillo et al, IBM ® Technical Disclosure Bulletin, Vol. 20, No. 9, February 1978, pp. 3378-3379. For purposes of explanation and comparison with the present invention, this prior art method is described next with reference to the associated apparatus schematically represented in FIGS. 1A-1F and 4.

This prior art method begins with a thin conductive metal, e.g. copper, layer 1 or foil that has peelably adhered to its surface 1a a temporary carrier or support base 2 along the latter's outer surface 2a, FIG. 1A. Formation of the printed circuit pattern that is ultimately to become part of the laminate 6, FIG. 1F, is provided by an additive plating process which takes place on the other surface 1b of layer 1. More particularly, after applying to the surface 1b, a layer 3 of an appropriate photoresist and predetermined type, e.g. negative, layer 3 is exposed and developed with the desired circuit pattern using well known photolithographic techniques. For sake of clarity layer 3 is shown in phantom outline in FIG. 1A. The unexposed regions of layer 3 are removed leaving openings 3a in the remaining, i.e. exposed, regions 3b of layer 3 as shown in FIG. 1B. Next, conductive circuit members, e.g. lines 4, are additively plated to surface 1b through the openings 3a resulting in the deposition of the desired circuit pattern on surface 1b. Next, the photoresist regions 3b are removed by an appropriate chemical stripping process resulting in the structure of FIG. 1C.

One or more stacked sheets, not shown, of an uncured epoxy fiber-glass are then juxtaposed on top of the conductive lines 4 of the structure of FIG. 1C and subjected to an appropriate curing process. As a result of the curing process, the sheets are coalesced into an integral layer 5 which forms on top of the exposed regions, i.e those regions not plated to by the lines 4, of the surface 1b of layer 1 and around the sides and top of the lines 4 thereby embedding the conductive lines 4 in the layer 5 except for the conductor surfaces 4a, cf. FIG. 1D. Thus, surfaces 4a are flush mounted with the surface 5a of layer 5. Next, base member 2 is peeled away from the surface 1a of layer 1, as shown in FIG. 1E.

Thereafter, layer 1 is removed by a flash etchant from surface 5a leaving a laminate 6 with the conductive lines 4 flush mounted, i.e. with the surfaces 4a thereof flush mounted with the surface 5a as aforedescribed and shown in FIG. 1F. Laminate 6 is now ready to be appropriately stacked with one or more other dielectric laminates whereupon the stack is subjected to a laminating process. The laminating process coalesces the individual laminates and more particularly the individual dielectric layers thereof into an integral, i.e. monolithic, laminated multilayer printed circuit board in a manner well known to those skilled in the art.

Heretofore, the laminated multilayer printed circuit boards fabricated with the aforedescribed prior art method were susceptible to delaminating and hence were unreliable and/or defective. The delamination was the result of the poor adhesion effected between the surface 4a of the conductive lines 4 to the dielectric layer of the adjacent laminate and/or the poor adhesion between respective dielectric layers of adjacent laminates. Moreover, with the advent of high density conductor laminates, the problem becomes even more acute.

Heretofore, in most of the prior art of which I am aware, the aforedescribed lamination problem is either not addressed or, if addressed, the solution thereof is not amenable for implementation into the aforedescribed method without a partial or complete change thereof thereby adding to the complexity and/or expense of the basic method. Examples of the prior art in which the lamination problem is not addressed are as follows, to wit: U.S. Pat. Nos. 2,692,190; 3,152,938; 3,324,014; 3,791,858; 3,998,601; U.S. Pat. No. Re. 29,820; the publications appearing in the IBM ® Technical Disclosure Bulletin, viz., "Flush Printed Circuits", E. D. Miles, Vol. 1, No. 2, August 1958, p. 25, "Mechanically Bonded Printed Circuit", M. M. Haddad et al, Vol. 2, No. 1, June 1959, p. 9, "Multilayer Laminated Circuit Construction", M. M. Haddad, Vol. 7, No. 2, July 1964, pp. 154-155, "Flush Molding Of Printed Circuitry", E. J. Webb et al, Vol. 8, No. 8, January 1966, pp. 1025-1026, "Additive Multilayer Circuit" M. M. Haddad, Vol. 8, No. 11, April 1966, p. 1482, "Molded Printed Circuits", X. Kollmeier et al, Vol. 9, No. 11, April 1967, pp. 1520-1521, "Multilayer Circuit Fabrication", A. E. Peter et al, Vol. 10, No. 4, September 1967, pp. 359-360, and the aforementioned "High Resolution Circuitization Process", J. G. Cutillo, Vol. 20, No. 9, February 1978, pp. 3389-3390; and the publication entitled "Other Forms, Variations of Well-Known Techniques Designed For Printed-Wiring Reliability", Electronic Design. The inventive method of the present invention overcomes the aforementioned problems in a more reliable and less expensive manner as will become apparent from the description hereinafter.

SUMMARY OF THE INVENTION

It is an object of this invention to provide a method for fabricating multilayer laminated printed circuit apparatus not readily susceptible to delaminating.

It is another object of this invention to provide a method for fabricating multilayer laminated printed circuit apparatus in a reliable, simple and inexpensive manner.

According to one aspect of the invention there is provided a method for fabricating multilayer laminated printed circuit apparatus. To this end there is provided a thin conductive first layer which has first and second opposite surfaces. Also provided is temporary base member means which has an outer surface peelably adhered to the first surface of the first layer. The temporary base member means has a predetermined surface profile characteristic on this outer surface that provides a conformal surface profile characteristic on at least the first surface of the conductive first layer. Plural printed circuit members are additively plated to the second surface in a predetermined printed circuit pattern. Any portions of the first layer not plated to by the circuit members are removed to expose the underlying parts of the outer surface of the base member means and thereby to expose the resulting formed sides between the first and second surfaces of the remaining portions of the first layer plated to by the circuit members. Thereafter, an uncured dielectric member means is provided over the printed circuit members.

Thereafter, the dielectric member means is cured into an integral dielectric second layer which has a predetermined surface in contact with the underlying parts of the outer surface of the temporary base member means. The dielectric second layer embeds therein the circuit members and the sides of the remaining portions of the first layer and such that the first surfaces of the remaining portions are in flush mounting relationship with respect to the predetermined surface of the cured second layer.

The temporary base member means is thereafter peeled away to expose the predetermined surface of the dielectric second layer and the first surfaces of the remaining portions of the first layer, the predetermined surface of the dielectric second layer being adapted for lamination to another predetermined dielectric third layer of the board. The conformal surface characteristic of the first surfaces of the remaining portions provide an adhering surface to the dielectric third layer so as to prevent delamination between the dielectric second and third layers.

According to another object of the invention, the predetermined surface profile characteristic of the temporary base member means further provides a conformal surface profile characteristic in the second surface of the first layer so that the conformal surface profile characteristic of the second surface coacts with the additive plating of the circuit members to the second surface to increase the plating bond therebetween and thereby further prevent delamination between the dielectric second and third layers.

According to another aspect of the invention, alternative-to or in combination-with the last mentioned aspect, the predetermined surface profile characteristic of the temporary base member means further provides a conformal surface profile characteristic in the predetermined surface of the dielectric second layer so that the conformal surface profile characteristic of the second layer predetermined surface coacts with the laminating of the dielectric second and third layers to increase the lamination bond therebetween and thereby further prevent delamination therebetween.

The foregoing and other objects, features and advantages of the invention will be apparent from the more particular description of the preferred embodiment of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENT

The preferred embodiment of the method of the present invention for fabricating multilayer laminated printed circuit apparatus is described herein with reference to FIGS. 2A-2E.

Figure 2A:
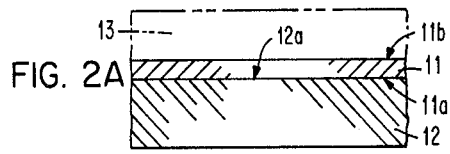
FIGS. 2A-2E are partial cross sectional views schematically illustrating certain stages of the preferred embodiment of the method of the present invention associated with the fabrication of a laminate to be used to produce multilayer laminated printed circuit apparatus in accordance with the principles of the present invention.

Accordingly, referring to FIG. 2A, there is provided a thin conductive first layer 11 which has first and second opposite surfaces 11a and 11b, respectively. Also provided is temporary carrier means, shown as a base member 12, which has an outer surface 12a peelably adhered to the superimposed surface 11a of layer 11. Layer 11 and base member 12 preferably have planar configurations and are preferably both made of copper with a suitable release agent, not shown, such as a chromium separator layer therebetween. These are readily available as vendor supplied commercial stock. For example, in one such commercially available stock suitable for this purpose, layer 11 is electrolytic plated copper approximately 0.0002 inches thick and the base member 12 is electrolytic copper foil approximately 0.0028 inches thick. It should be understood, however that other metals and other metal combinations may be used for the layer 11 and base member 12 such as, for example, a copper layer 11 and aluminum base member 12. The outer surface 12a of the temporary base member 12 has a microscopic rough-like surface profile characteristic that provides a conformal surface profile characteristic on at least the first surface 11a of layer 11 and which in the preferred embodiment also provides a conformal surface profile characteristic on the other surface 11b as well, as is explained hereinafter in greater detail.

Surface 11b is used for additively plating thereon plural printed circuit members 14 as next described, surface 11b and layer 11 being herein sometimes referred to as the plating surface and plating layer, respectively. To plate the members 14 to the second surface 11b in a predetermined printed circuit pattern, a blanket layer of photoresist 13, e.g. a negative type photoresist such as Riston T168 (Registered Trademark E. I. DuPont De Nemours Co.), is first applied to surface 11b, FIG. 2A. After exposure through an appropriate image mask, not shown, containing the image of the desired printed circuit pattern, resist 13 is developed and the unexposed portions removed in a manner well known to those skilled in the art. As a result, the openings 13a in the remaining exposed portions 13b of the resist 13 are left in the desired circuit pattern, cf. FIG. 2B. Next, the printed circuit members 14 are plated through the openings 13a on the surface 11b of layer 11 and then the exposed resist portions 13b are removed, e.g. by chemical stripping.

Figure 1A:
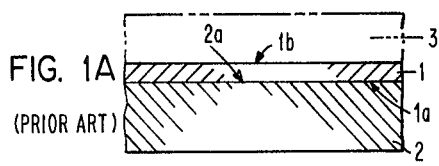
FIGS. 1A-1F are partial cross sectional views schematically illustrating certain stages of a prior art method associated with the fabrication of a printed circuit laminate to be used to produce a multilayer laminated printed circuit board.
Figure 1B:
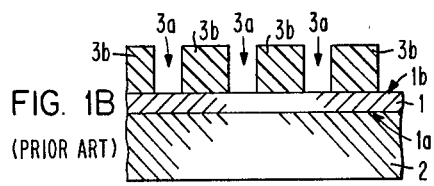
Figure 1C:
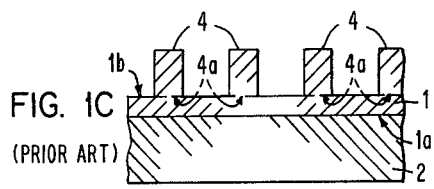
Figure 2B:
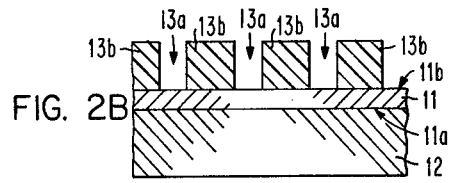
Figure 2C:
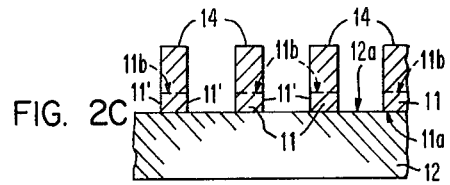

The description up to now of the inventive method, it should be noted, is substantially similar to the prior art method described heretofore with regards to FIGS. 1A-1C. However, in accordance with the principles of the present invention, the next step of the inventive method departs differently therefrom. Referring to FIG. 2C, in this step, any portions of the first layer 11 which are not plated to by the circuit members 14 are removed, e.g. by an appropriate etching process using an appropriate etch resistant mask, not shown, applied to the members 14 in a manner well known to those skilled in the art, which mask in turn is subsequently removed. An etchant suitable for this purpose is a persulfate such as ammonium persulfate. A conventional immersion tin process is suitable for applying the etch resist mask and can be subsequently removed with an appropriate chemical stripping process. As a result, those portions of the first layer 11 which were previously covered by the photoresist portions 13b in FIG. 2B are now removed as shown in FIG. 2C thereby exposing the underlying parts of the outer surface 12a of the base member 12 and the resulting sides 11' formed between the first and second surfaces 11a and 11b, respectively, of the remaining portions of the first layer 11 plated to by the circuit members 14. It should be noted that the layer 11 is personalized and in register with the circuit pattern of the circuit members 14 as a result of the step of FIG. 2C. Thereafter, an uncured dielectric member means, not shown, is provided over the printed circuit members 14. Preferably, the dielectric member means is comprised of a stack of epoxy fiber-glass sheets, also known as pre-preg, the number of sheets being commensurate with the thickness desired for the resultant laminate being produced and the stack being placed on top of the members 14.

Figure 2D:
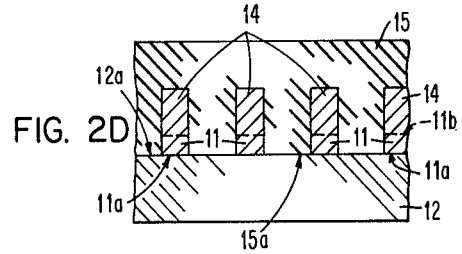

Thereafter, the dielectric member means is cured and coalesces into an integral dielectric layer 15 which has a predetermined surface 15a in contact with the aforesaid underlying parts of the outer surface 12a of the temporary base member 12 as shown in FIG. 2D. Typical parameters for effecting the cure are 320 Degrees F. at 500 psi for approximately 1 hour. As shown in FIG. 2D, when so cured, the dielectric layer 15 embeds the circuit members 14 and the sides 11' of the remaining portions of layer 11 and such that the first surfaces 11a of the last mentioned remaining portions are in flush mounting relationship with respect to the surface 15a of layer 15.

Figure 2E:
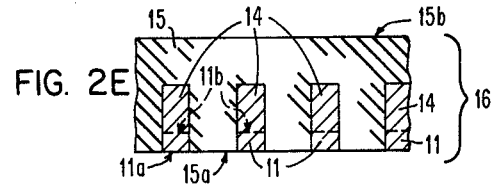

The temporary base member 12 is thereafter peeled away to expose the surface 15a of the dielectric layer 15 and the surfaces 11a of the remaining portions of the layer 11 resulting in the laminate 16 of FIG. 2E. Surface 15a of the dielectric layer 15 of laminate 16, FIG. 2E, is adapted and now ready to be laminated to another dielectric layer, not shown, which is to subsequently positioned adjacent to it. Moreover, in accordance with the principles of the present invention, the conformal surface characteristic of the first surfaces 11a of the remaining portions of layer 11 provide an adhering surface to this other dielectric layer that prevents, i.e. mitigates, delamination between the dielectric layer 15 and this other layer as will be explained in greater detail hereinafter. It should be understood that laminate 16 is just one of the many plural laminates that ultimately become part of the monolithic multilayer laminated printed circuit board. The other dielectric layer to which the surface 15a of laminate 16 will be laminated may itself be part of another metallized laminate or may be a non-metallized such as the dielectric spacer 17 of the laminated printed circuit board of FIG. 3 next to be described.

Figure 3:
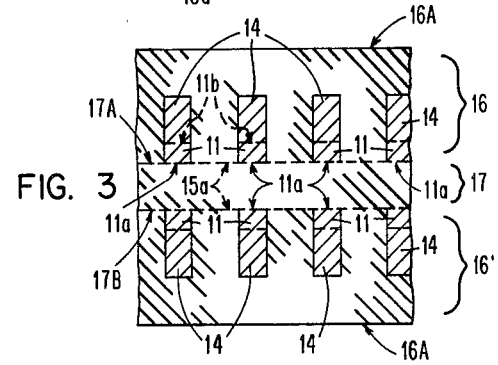
FIG. 3 is a partial cross sectional view schematically illustrating a monolithic multilayer laminated printed circuit board laminated in accordance with the principles of the present invention.

For sake of simplicity and explanation, there is shown by way of example in FIG. 3 a monolithic multilayer laminated printed circuit board configuration having two outer laminates 16 and 16' which are laminated to an intermediate dielectric spacer laminate 17. In fabricating the board of FIG. 3, the laminates 16 and 16' are individually made in accordance with the inventive method as described with reference to FIGS. 2A-2E. Preferably, laminate 17 is a stack of pre-preg uncured sheets of sufficient height to provide the desired spacing between laminates 16 and 16'.

For the configuration example of FIG. 3, the laminates 16, 16', 17 are stacked so that the respective surfaces 11a and 15a of the outer laminates 16 and 16' face each other and are in contacting relationship with the respective outer surfaces 17A and 17B of the aforementioned stack of sheets of the intermediate spacer laminate 17. The so stacked assembly of laminates 16, 16', 17 are then cured causing the sheets of laminate 17 to cure and coalesce with respect to each other, as well as causing the coalescence of the laminates 16, 16' and 17 into a monolithic laminated structure, which in the given configuration example results in two inner conductive layers, i.e. upper and lower conductors 14. Typical parameters for effecting the cure and coalescence of the laminates 16, 16' and 17 are similar to those aforementioned for curing the individual laminate 16. As is customary, one or both of the respective outer surfaces 16A of the outer laminates 16 and 16' may also be provided, and preferably prior to the final assembly and lamination into the monolithic board, with an outer integral metallization layer or layers, not shown, as the case might be. These outer layers may also be personalized thereby providing an additional one or two layers of metallization. Appropriate conductive vias are provided between all layers, i.e. inner and outer layers, in a manner well known to those skilled in the art and omitted herein for sake of clarity. Preferably, the outer metallization layers are personalized after the final lamination takes place as is also customary and well known in the art.

In accordance with the principles of the present invention, the conformal surface characteristic of the first surfaces 11a of each of the laminates 16 and 16' provide a respective adhering surface to the dielectric layer 17 and thereby prevents delamination of each of the layers 16 and 16' with respect to layer 17.

In the preferred embodiment of the invention, according to another aspect of the invention, the predetermined surface profile characteristic of the temporary base member 12 in addition to providing the conformal surface characteristic to the surfaces 11a also further provides a conformal surface profile characteristic in the second surface 11b of the layer 11 so that the conformal surface profile characteristic of the second surface 11b coacts with the additive plating of the circuit members 14 to the second surface 11b to increase the plating bond between members 14 and layer 11. Thus, in combination the conformal surface profile characteristic of the first surfaces 11a and the conformal surface profile characteristic of the second surface 11b produce a synergistic effect that further prevents, i.e. mitigates, delamination between the dielectric layer 15 and the other dielectric layer that is positioned against and laminated to its surface 15a, such as, for example, the layer 17 of the printed circuit board of FIG. 3.

Alternatively and/or in combination with this last mentioned aspect, in the preferred embodiment, the predetermined surface profile characteristic of the temporary base member 12 in addition to providing the predetermined surface profile characteristic to the surfaces 11a, or to the surfaces 11a and 11b, as the case might be, also further provides a conformal surface profile characteristic in the predetermined surface 15a of the dielectric layer 15 so that the conformal surface profile characteristic of the surface 15a coacts with the laminating of the dielectric layer 15 and the other dielectric layer that is positioned against and laminated to its surface 15a to increase the lamination bond between layer 15 and this other layer. Thus, in combination the conformal surface profile characteristic of the first surfaces 11a and the conformal surface profile characteristic of the surface 15a of layer 15, or in combination the conformal surface profile characteristics of the surfaces 11a, 11b and of the surface 15a of layer 15, produce a synergistic effect that further prevents, i.e. mitigates, delamination between the dielectric layer 15 and the other dielectric layer that is positioned against and laminated to its surface 15a, such as, for example, the layer 17 of the printed circuit board of FIG. 3.

Figure 4:
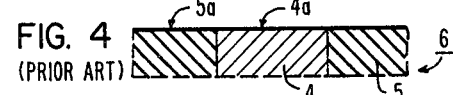
FIGS. 4 and 5 are inverted enlarged partial cross sectional views schematically illustrating the surface profile characteristics of the laminates of FIGS. 1F and 2E, respectively.
Figure 5:
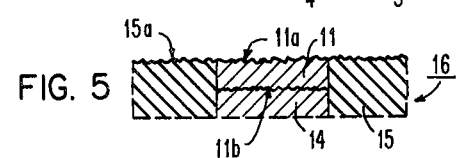

Referring now to FIG. 5, these various aspects will now be explained with the aid of the idealized enlarged schematic shown therein. More particularly, the rough-like surface profile characteristic of the surface 12a of the base member 12 imparts in the outer surface 11a of layer 11 a conformal rough-like surface profile characteristic. As a result, the imparted rough-like surface profile characteristic of surfaces 11a provide greater surface contacting areas that allow individual greater adhering areas between the metal surface area 11a and adjacent dielectric layer, not shown, that is to be laminated to surface 15a of layer 15 of the laminate 16 and hence inhibits delamination between layer 15 and the dielectric layer, not shown, laminated to its surface 15a. By way of comparison, the prior art laminate 6 has a relatively smooth flush mounted area 4a of the plated conductor 4 as shown in FIG. 4, resulting from the intentional removal of its layer 1 in the prior art method, and hence has less contact area for adherence and hence is more susceptible to delamination between its layer 5 and the adjacent layer, not shown, laminated to its surface 5a.

Moreover, the lamination bond is further improved in the present invention by judiciously selecting the thickness of the layer 11 in FIG. 5 so that the rough-like surface profile characteristic of the surface 12a of the base member 12 is preferably also imparted to the surface 11b of layer 11. The imparted surface profile characteristic again provides an increased surface area in the plating surface 11b which increases the plating bond between the metal layer 11 and conductors 14 plated thereto, and which in turn inhibits delamination between the layer 15 and the other aforementioned dielectric layer, not shown, which is laminated to surface 15a. On the other hand, in the prior art structure of FIG. 4, it should be noted that the layer 1 is intentionally eliminated, i.e. removed, and hence cannot inhibit delamination between its layer 5 and the adjacent layer, not shown, laminated to its surface 5a.

Figure 1D:
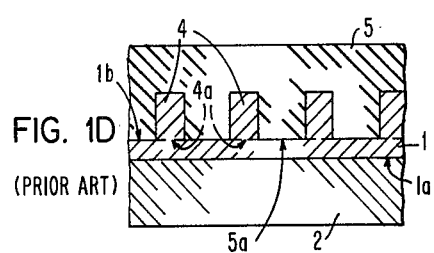
Figure 1E:
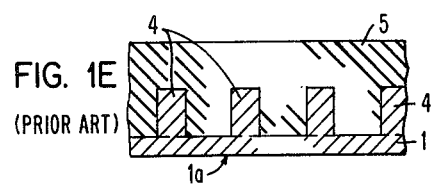
Figure 1F:
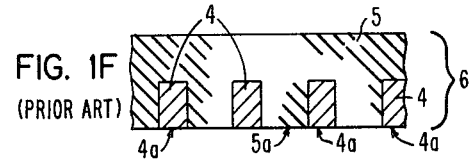

Moreover, when the dielectric member means coalesces into layer 15, preferably the rough-like surface profile characteristic of surface 12a of member 12 is also imparted into surface 15a of layer 15 with which it is placed in contact as aforedescribed, cf. FIG. 2D, by virtue of the previous removal of the portions of layer 11 thereat. Again, this imparted rough-like surface profile characteristic in surface 15a enhances the lamination bond between layer 15 and the other dielectric layer, not shown, laminated to its surface 15a. However, in the prior art structure of FIG. 4, layer 1 thereof is not removed until after dielectric layer 5 is formed, cf. FIGS. 1D and 1E, producing a shield-like effect between member 2 and layer 5 during the latter's formation. Hence, surface 5a of layer 5 is relatively smooth and has less contact area as shown in FIG. 4 and thus more apt to delaminate from the other dielectric layer, not shown, subsequently laminated to surface 5a.

As aforementioned, the configuration of FIG. 3 is used by way of example for sake of explanation in describing the principles of the present invention. However, it should be understood that it may be modified or other configurations may be employed in practicing the present invention. For example, as an alternative configuration, plural laminates 16 may be stacked one on top of each other so that surface 15a of each particular laminate is in contact with surface 15b of the next adjacent laminate of the stack with or without the use of additional non-metallized dielectric layers between adjacent laminates 16; or, alternatively, plural additional laminates 16 stacked in the manner just described may be placed on one or both sides 16A of the laminates 16, 16' of the stack associated with the structure of FIG. 3 prior to curing of layer 17. The so stacked assemblies are thereafter coalesced into a monolithic structure.

Thus, while the invention has been described with reference to a preferred embodiment thereof, it will be understood by those skilled in the art that various changes in form and details may be made without departing from the scope of the invention.

I claim:

1. A method for fabricating multilayer laminated printed circuit apparatus, said method comprising the steps of:

providing a thin conductive first layer having first and second opposite surfaces, and temporary base member means having an outer surface peelably adhered to said first surface, said temporary base member means having a predetermined surface profile characteristic on said outer surface for providing a conformal surface profile characteristic on at least said first surface of said conductive first layer, additively plating plural printed circuit members to said second surface in a predetermined printed circuit pattern, removing any portions of said first layer not plated to by said circuit members to expose the underlying parts of said outer surface of said base member means and thereby to expose the sides between said first and second surfaces of the remaining portions of said first layer plated to by said circuit members, thereafter providing an uncured dielectric member means over said printed circuit members of said pattern, thereafter curing in a predetermined manner said dielectric member means into an integral dielectric second layer having a predetermined surface in contact with said underlying parts of said outer surface of said temporary base member means, said dielectric second layer embedding therein said circuit members and said sides of said remaining portions of said first layer and having said first surfaces of said remaining portions in flush mounting relationship with respect to said predetermined surface, and thereafter peeling away said temporary base member means to expose said predetermined surface of said dielectric second layer and said first surfaces of said remaining portions of said first layer, said predetermined surface of said dielectric second layer being adapted for lamination to another predetermined dielectric third layer of said board, and said conformal surface characteristic of said first surfaces of said remaining portions providing an adhering surface to said dielectric third layer to prevent delamination between said dielectric second and third layers.

2. The method according to claim 1 wherein said predetermined surface profile characteristic of said temporary base member means further provides a conformal surface profile characteristic in said second surface of said first layer, said conformal surface profile characteristic of said second surface coacting with said additive plating of said circuit members to said second surface to increase the plating bond therebetween and thereby further prevent said delamination.

3. The method according to claim 1 wherein said predetermined surface profile characteristic of said temporary base member means further provides a conformal surface profile characteristic in said predetermined surface of said dielectric second layer, said conformal surface profile characteristic of said second layer predetermined surface coacting with the laminating of said dielectric second and third layers to increase the lamination bond therebetween and thereby further prevent said delamination.

4. The method according to claim 3 wherein said predetermined surface profile characteristic of said temporary base member means further provides a conformal surface profile characteristic in said second surface of said first layer, said conformal surface profile characteristic of said second surface coacting with said additive plating of said circuit members to said second surface to increase the plating bond therebetween and thereby further prevent said delamination.

5. The method according to claim 1 wherein said predetermined surface profile characteristic of said temporary base member means comprises a rough-like surface profile.

6. A method for fabricating multilayer laminated printed circuit apparatus, said method comprising the steps of:

providing a thin conductive metal first layer having first and second planar surfaces, and a temporary base member having an outer surface peelably adhered to said first surface, said first surface being superimposed on said outer surface, said temporary base member further having a rough-like surface profile characteristic on said outer surface for providing a conformal rough-like surface profile characteristic on at least said first surface of said conductive first layer, additively plating plural printed circuit members to said second surface in a predetermined printed circuit first pattern, etching away any portions of said first layer not plated to by said circuit members to expose the underlying parts of said outer surface of said base and thereby to expose the sides between said first and second surfaces of the remaining portions of said first layer plated to by said circuit members, said remaining portions being arranged in a second pattern substantially similar to and in register with said first pattern of said printed circuit members plated to said remaining portions, thereafter providing an uncured dielectric member means over said printed circuit members of said first pattern, thereafter curing in a predetermined manner said dielectric member means into an integral dielectric second layer having a predetermined surface in contact with said underlying parts of said outer surface of said temporary base member, said dielectric second layer embedding therein said circuit members and said sides of said remaining portions of said first layer and having said first surfaces of said remaining portions in flush mounting relationship with respect to said predetermined surface, and thereafter peeling away said temporary base member to expose said predetermined surface of said dielectric second layer and the flush mounted said first surfaces of said remaining portions of said first layer, said predetermined surface of said dielectric second layer being adapted for lamination to another predetermined dielectric third layer of said board, and said conformal rough-like surface profile characteristic of said flush mounted first surfaces of said remaining portions providing an adhering surface to said dielectric third layer to prevent delamination between said dielectric second and third layers.

7. The method according to claim 6 wherein said rough-like surface profile characteristic of said temporary base member further provides a conformal rough-like surface profile characteristic in said second surface of said first layer, said conformal surface profile characteristic of said second surface coacting with said additive plating of said circuit members to said second surface to increase the plating bond therebetween and thereby further prevent said delamination.

8. The method according to claim 6 wherein said rough-like surface profile characteristic of said temporary base member further provides a conformal rough-like surface profile characteristic in said predetermined surface of said dielectric second layer, said conformal surface profile characteristic of said second layer predetermined surface coacting with the laminating of said dielectric second and third layers to increase the lamination bond therebetween and thereby further prevent said delamination.

9. The method according to claim 8 wherein said rough-like surface profile characteristic of said temporary base member further provides a conformal surface rough-like profile characteristic in said second surface of said first layer, said conformal surface profile characteristic of said second surface coacting with said additive plating of said circuit members to said second surface to increase the plating bond therebetween and thereby further prevent said delamination.

10. A method for fabricating multilayer laminated printed circuit apparatus, said method comprising the steps of:

providing a thin conductive copper first layer having first and second planar surfaces, and a copper temporary base member having an outer surface peelably adhered to said first surface, said first surface being superimposed on said outer surface, said temporary base member further having a rough-like surface profile characteristic on said outer surface for providing a conformal rough-like surface profile characteristic on at least said first surface of said conductive first layer, applying a layer of photoresist to said second surface, exposing said photoresist with an image of a predetermined printed circuit first pattern, and developing said image therein to provide a plating mask having said first pattern, additively plating copper through said plating mask to form plural copper printed circuit members plated to said second surface in said printed circuit first pattern, and thereafter removing said plating mask, applying an etch resist mask to said circuit members, etching away through said etch resist mask any portions of said first layer not plated to by said circuit members to expose the underlying parts of said outer surface of said base and thereby to expose the sides between said first and second surfaces of the remaining portions of said first layer plated to by said circuit members, said remaining portions being arranged in a second pattern substantially similar to and in register with said first pattern of said printed circuit members plated to said remaining portions, and thereafter removing said etch resist mask, thereafter providing a stack of uncured dielectric pre-preg sheets on top of said printed circuit members, thereafter curing in a predetermined manner said stack of dielectric pre-preg sheets into an integral coalesced dielectric second layer having a predetermined surface in contact with said underlying parts of said outer surface of said temporary base member, said dielectric second layer embedding therein said circuit members and said sides of said remaining portions of said first layer and having said first surfaces of said remaining portions in flush mounting relationship with respect to said predetermined surface, and thereafter peeling away said temporary base member to expose said predetermined surface of said dielectric second layer and the flush mounted said first surfaces of said remaining portions of said first layer, said predetermined surface of said dielectric second layer being adapted for lamination to another predetermined dielectric third layer of said board, and said conformal rough-like surface profile characteristic of said flush mounted first surfaces of said remaining portions providing an adhering surface to said dielectric third layer to prevent delamination between said dielectric second and third layers.

11. The method according to claim 10 wherein said rough-like surface profile characteristic of said temporary base member further provides a conformal rough-like surface profile characteristic in said second surface of said first layer, said conformal surface profile characteristic of said second surface coacting with said additive plating of said circuit members to said second surface to increase the plating bond therebetween and thereby further prevent said delamination.

12. The method according to claim 10 wherein said rough-like surface profile characteristic of said temporary base member further provides respective conformal rough-like surface profile characteristics in said predetermined surface of said dielectric second layer and in said second surface of said first layer, said conformal surface profile characteristic of said second layer predetermined surface coacting with the laminating of said dielectric second and third layers to increase the lamination bond therebetween and said conformal surface profile characteristic of said second surface coacting with said additive plating of said circuit members to said second surface to increase the plating bond therebetween, the increase of said lamination and plating bonds thereby further preventing said delamination between said second and third dielectric layers.

* * * * *